United States Patent
Shimizu

(10) Patent No.: US 8,513,578 B2
(45) Date of Patent: Aug. 20, 2013

(54) ELECTROMAGNETIC WAVE PROCESSING APPARATUS

(75) Inventor: Masahiro Shimizu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 155 days.

(21) Appl. No.: 13/109,366

(22) Filed: May 17, 2011

(65) Prior Publication Data

US 2011/0215090 A1    Sep. 8, 2011

Related U.S. Application Data

(63) Continuation of application No. PCT/JP2009/069491, filed on Nov. 17, 2009.

(30) Foreign Application Priority Data

Nov. 17, 2008 (JP) .................................. 2008-293820

(51) Int. Cl.
- *H05B 6/10* (2006.01)
- *C21D 1/773* (2006.01)
- *H05B 6/02* (2006.01)

(52) U.S. Cl.
CPC *C21D 1/773* (2013.01); *H05B 6/02* (2013.01); *H05B 6/101* (2013.01)
USPC ............................ 219/651; 438/769; 438/787

(58) Field of Classification Search
USPC ......... 219/651, 678, 390, 405, 411; 118/708, 118/712, 715, 724, 725, 729; 439/770, 769, 439/694, 735, 738; 257/77, 183, 616
See application file for complete search history.

(56) References Cited

U.S. PATENT DOCUMENTS

| | | | |
|---|---|---|---|
| 5,689,614 A | 11/1997 | Gronet et al. | |
| 6,057,557 A * | 5/2000 | Ichikawa | 257/59 |
| 6,818,864 B2 | 11/2004 | Ptak | |
| 2001/0041462 A1* | 11/2001 | Kashiwagi et al. | 438/787 |
| 2004/0121617 A1 | 6/2004 | Kawano et al. | |
| 2005/0005844 A1* | 1/2005 | Kitagawa et al. | 118/715 |
| 2006/0029735 A1* | 2/2006 | Ko | 427/248.1 |
| 2007/0167029 A1* | 7/2007 | Kowalski et al. | 438/769 |
| 2007/0224839 A1 | 9/2007 | Shimizu | |

FOREIGN PATENT DOCUMENTS

| | | |
|---|---|---|
| JP | 4-127532 | 4/1992 |
| JP | 5-21420 | 1/1993 |
| JP | 7-135093 | 5/1995 |
| JP | 2001-237238 | 8/2001 |
| JP | 2002-280380 | 9/2002 |
| JP | 2004-134674 | 4/2004 |
| JP | 2004-296245 | 10/2004 |
| JP | 2005-268624 | 9/2005 |
| JP | 2007-88177 | 4/2007 |
| JP | 2007-258286 | 10/2007 |
| JP | 2008-112922 | 5/2008 |
| JP | 2008-124424 A | 5/2008 |

OTHER PUBLICATIONS

Japanese International Search Report mailed Jan. 12, 2010 in PCT/JP2009/069491 filed Nov. 17, 2009 (and English Translation).

* cited by examiner

*Primary Examiner* — Henry Yuen
*Assistant Examiner* — Thien S Tran
(74) *Attorney, Agent, or Firm* — Oblon, Spivak, McClelland, Maier & Neustadt, L.L.P.

(57) ABSTRACT

A processing apparatus using an electromagnetic wave is provided to perform a heat treatment on a target object. The processing apparatus includes a metallic processing chamber; a loading/unloading opening provided in one end of the processing chamber; a closing body capable of closing and opening the loading/unloading opening; a holding unit loaded and unloaded into and from the inside of the processing chamber through the loading/unloading opening, holding target objects at a predetermined interval, the holding unit being made of a material allowing the electromagnetic wave to transmit therethrough; an electromagnetic wave supply unit for introducing the electromagnetic wave into the processing chamber; a gas introducing unit for introducing a gas into the processing chamber; and a gas exhaust unit for exhausting an atmosphere in the processing chamber.

15 Claims, 9 Drawing Sheets

ELECTROMAGNETIC WAVE PROCESSING APPARATUS

This application is a Continuation Application of PCT International Application No. PCT/JP2009/069491 filed on Nov. 17, 2009, which designated the United States.

FIELD OF THE INVENTION

The present invention relates to a batch processing apparatus for performing a predetermined process by heating a semiconductor substrate such as a silicon substrate or the like by irradiating an electromagnetic wave such as a microwave, a high frequency wave or the like to the semiconductor substrate.

BACKGROUND OF THE INVENTION

In general, when a desired semiconductor device is manufactured, a semiconductor substrate is repeatedly subjected to various heat treatments such as a film forming process, a pattern etching process, an oxidation/diffusion process, a quality modification process, an annealing process and the like on the semiconductor substrate. Along with a recent trend toward a high density, a multilayered structure and high integration of semiconductor devices, requirements on device have been increasingly stricter. In particular, in-plane uniformity improvement in heat treatment on a semiconductor substrate and process quality improvement are strongly required.

For example, when a channel layer of a transistor as a semiconductor device is processed, it is typical to perform an annealing process after implanting ions of impurity atoms into the channel layer in order to activate the impurity atoms.

In this case, if the annealing process is performed for a long period of time, the atomic structure becomes stable. However, the impurity atoms are diffused deeply into a film to thereby pass through the channel layer downward. Therefore, the annealing process needs to be performed for a shortest possible period of time. In other words, in order to stabilize the atomic structure while preventing the impurity atoms from passing through the channel layer having a thin film thickness, it is necessary to rapidly increase a temperature of a semiconductor substrate to a high temperature. Further, after the annealing process, it is necessary to rapidly decrease the temperature thereof to a low temperature at which the diffusion does not occur.

In particular, recently, a transistor device having a structure in which an ultra shallow region such as a source-drain extension region or the like is provided in a channel layer has been suggested. In order to maintain electrical characteristics in the shallow region, it is required for the impurity atoms to be activated without being diffused by applying the rapid increase and decrease in temperature.

In order to achieve the above-described annealing process, a lamp annealing apparatus using a heating lamp (see, e.g., U.S. Pat. No. 5,689,614) and a heat treatment apparatus using an LED device or a laser device (see, e.g., Japanese Patent Application Publication Nos. 2004-296245 and 2004-134674, and U.S. Pat. No. 6,818,864) have been proposed.

However, as well known, in a manufacturing process of a semiconductor integrated circuit, various different materials are disposed on a surface of a semiconductor substrate.

For example, during a transistor manufacturing process, various materials having different optical characteristics, such as a silicon oxide film, e.g., $SiO_2$ film or the like, serving as an insulating film, a polysilicon film, a Cu film or an Al film serving as a wiring layer, a TiN film serving as a barrier film and the like, are distributed on the surface of the semiconductor substrate. In this case, various materials have different optical characteristics, e.g., reflectivity, absorptivity, transmittivity and the like, with respect to light, i.e., a visible ray or ultraviolet light used in the above annealing process. Accordingly, the amount of absorption energy varies depending on types of materials. Due to the differences in the optical characteristics, the annealing process may be hardly performed or may not be uniformly performed.

To that end, a heating apparatus for heating a semiconductor substrate by dielectric heating or induction heating by using an electromagnetic wave, such as a microwave, a high frequency wave or the like, of which wavelength is longer than those of visible ray and ultraviolet light has been proposed (see, e.g., Japanese Patent Application Publication Nos. H5-21420, 2002-280380, 2005-268624 and 2007-258286).

Since, however, each of the aforementioned processing apparatuses is configured as a single-wafer processing apparatus for processing semiconductor substrates one at a time, a throughput cannot be improved sufficiently. Further, when a millimeter wave having a wavelength ranging from a several millimeter to several tens of millimeters is applied as an electromagnetic wave, the amount of the reflected waves from the processing chamber becomes large and the electromagnetic wave source may be damaged if the amount of the electromagnetic waves that can be absorbed by a member to be heated in the processing chamber, i.e., the load absorption capacity (load capacity), is small. In order to avoid this problems, the apparatus needs to have an interlock function for stopping the operation of the electromagnetic wave source in case of generation of an excessive amount of reflected waves, and this leads to the increase of the apparatus cost.

SUMMARY OF THE INVENTION

The present invention provides a processing apparatus capable of improving a throughput by processing a plurality of processing target objects at a time and also capable of suppressing generation of an excessive amount of reflected waves by increasing a load absorption capacity (load capacity) in a processing chamber.

In accordance with an embodiment of the present invention, there is provided a processing apparatus for performing a heat treatment on a processing target object by using an electromagnetic wave, the processing apparatus including: a metallic processing chamber; a loading/unloading opening provided in one end of the processing chamber; a closing body for closing and opening the loading/unloading opening; a holding unit, loaded and unloaded into and from the processing chamber through the loading/unloading opening, for holding a plurality of processing target objects at a predetermined interval, the holding unit being made of a material allowing the electromagnetic wave to transmit therethrough; an electromagnetic wave supply unit for introducing the electromagnetic wave into the processing chamber; a gas introducing unit for introducing a gas into the processing chamber; and a gas exhaust unit for exhausting an atmosphere in the processing chamber.

In accordance with the present invention, it is possible to improve a throughput by processing a plurality of processing target objects at a time and suppress generation of an excessive amount of reflected waves by increasing a load absorption capacity in a processing chamber. Further, the need for the interlock function can be eliminated.

An inner surface of the processing chamber may be mirror-finished. In the embodiment of the present invention, an electromagnetic wave introduction opening for introducing the electromagnetic wave into the processing chamber may be formed at a processing chamber defining wall defining the processing chamber, and a transmission plate made of a material allowing the electromagnetic wave to transmit therethrough may be provided at the electromagnetic wave introduction opening.

The electromagnetic wave supply unit may include an electromagnetic wave generator for generating the electromagnetic wave, an incident antenna unit provided on the transmission plate, and a waveguide for connecting the electromagnetic wave generator and the incident antenna unit. In that case, a frequency of the electromagnetic wave generated by the electromagnetic wave generator may range from 10 MHz to 10 THz.

The processing chamber may be installed with a longitudinal direction thereof extending in a gravitational direction. The processing chamber may be installed with a longitudinal direction thereof extending along a horizontal direction. The loading/unloading opening side of the processing chamber may be connected to a loader chamber having a loading/unloading unit for loading and unloading the holding unit into and from the processing chamber.

The load chamber may be set to the atmospheric atmosphere. Further, the load chamber may be configured such that the atmosphere therein is selectively switched between the vacuum atmosphere and the atmospheric atmosphere.

The metallic processing chamber may have therein an inner processing chamber, made of a material allowing the electromagnetic wave to transmit therethrough, for accommodating therein the holding unit. Since the holding unit is accommodated in and surrounded by the inner processing chamber that allows the electromagnetic wave to transmit therethrough, it is possible to suppress heat dissipation caused by convection and radiation and suppress metal contamination from the outside.

The processing apparatus may further include an inner closing body for closing and opening an opening formed at the inner processing chamber to load and unload the holding unit into and from the inner processing chamber, the inner closing body being provided as one unit with the closing body for closing and opening the loading/unloading opening of the metallic processing chamber. The processing target object is, for example, a semiconductor substrate.

DETAILED DESCRIPTION OF THE EMBODIMENT

Hereinafter, embodiments of the present invention will be described in detail with reference to the accompanying drawings.

<First Embodiment>

Figure 1:
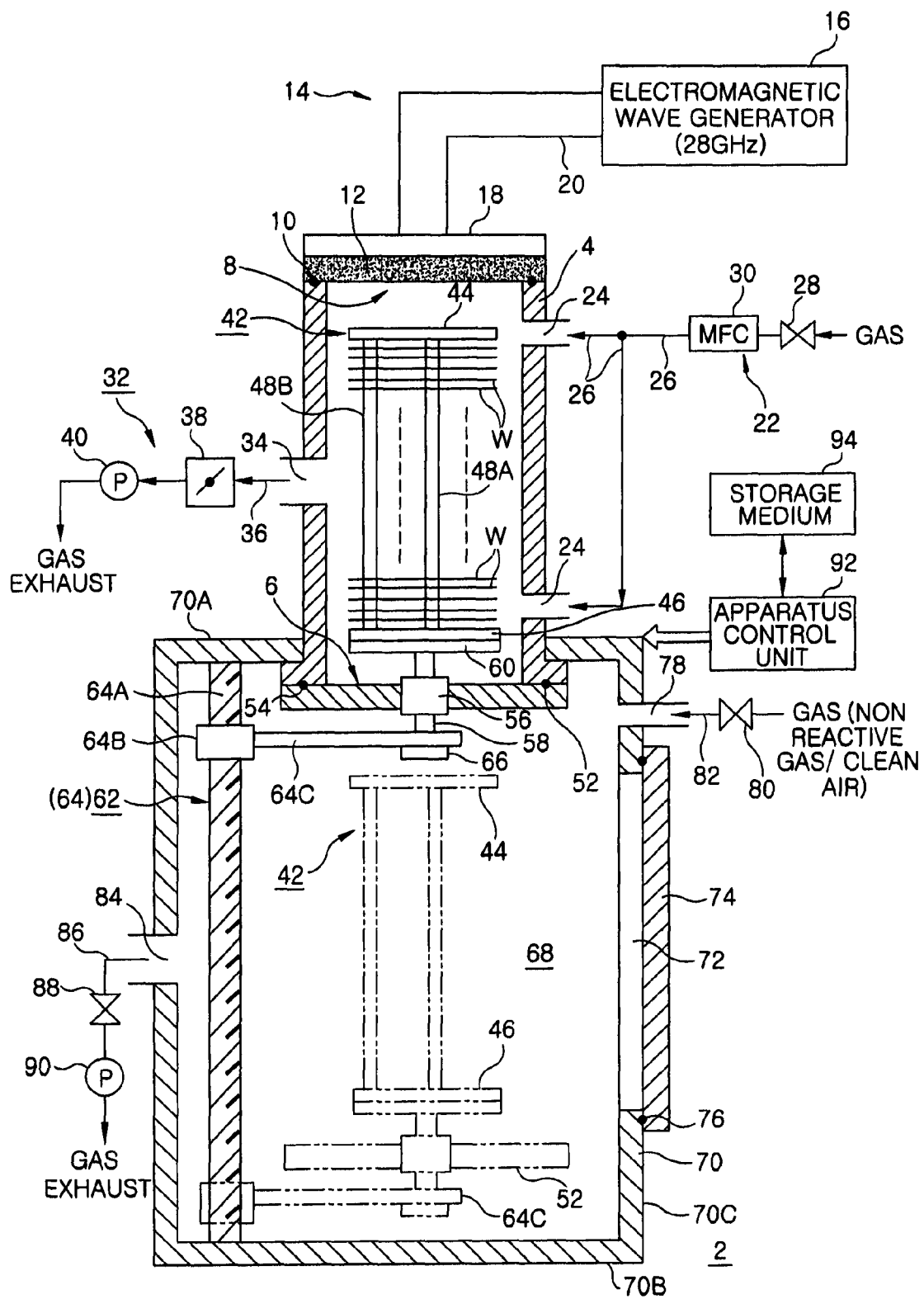
FIG. 1 is a cross sectional configuration view showing a processing apparatus in accordance with a first embodiment of the present invention.
Figure 2:
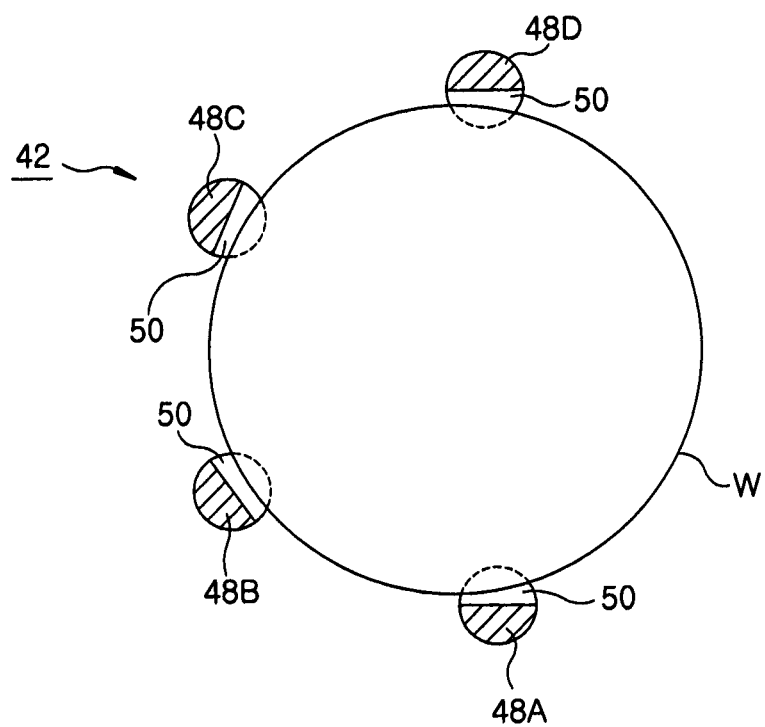
FIG. 2 is a cross sectional view showing a substrate boat as a holding unit.

FIG. 1 is a cross sectional configuration view showing a processing apparatus in accordance with a first embodiment of the present invention, and FIG. 2 is a cross sectional view showing a substrate boat as a holding unit.

As shown in FIG. 1, a processing apparatus 2 of the first embodiment includes a metallic processing chamber 4 having a predetermined length. The processing chamber 4 is formed in a cylindrical shape or a tubular shape having a quadrilateral cross section. In the present embodiment, the processing chamber 4 is disposed with a longitudinal direction thereof extending along a gravitational direction, and is configured as a so-called vertically elongated processing chamber 4. The processing chamber 4 may be made of metal, e.g., stainless steel, aluminum, aluminum alloy or the like. The inner surface of the processing chamber 4 is mirror-finished and allows multiple reflection of the introduced electromagnetic wave, so that a processing target object can be heated effectively.

One end, i.e., the bottom, of a processing chamber defining wall for defining the processing chamber 4 is opened and serves as a loading/unloading opening 6. The other end, i.e., the top (ceiling portion), of the processing chamber defining wall is opened and serves as an electromagnetic wave introduction opening 8.

A transmission plate 12 is provided at the electromagnetic wave introduction opening 8 via a sealing member 10 such as an O-ring or the like. The transmission plate 12 can be made of a material that allows an electromagnetic wave to pass therethrough, e.g., a ceramic material such as quartz, aluminum nitride or the like. The transmission plate 12 has a thickness that can endure a pressure in the processing chamber 4 during heat treatment. The thickness of the transmission plate 12 is set to, e.g., about 10 mm in case where the atmosphere in the processing chamber 4 needs to be vacuum exhausted.

An electromagnetic wave supply unit 14 for introducing an electromagnetic wave into the processing chamber 4 is provided at a position outside the transmission plate 12. Specifically, the electromagnetic wave supply unit 14 includes an electromagnetic wave generator 16 for generating the electromagnetic wave, an incident antenna unit 18 provided on the outside, i.e., an upper surface side, of the transmission plate 12, and a waveguide 20 for guiding the electromagnetic wave toward the incident antenna unit 18 by connecting the electromagnetic wave generator 16 and the incident antenna unit 18.

The frequency of the electromagnetic wave generated by the electromagnetic wave generator 16 can be set to fall within a range from, e.g., 10 MHz to 10 THz. In order to perform effective induction heating on the processing target object, it is preferable to use an electromagnetic wave having a frequency of 100 MHz or higher, and more preferable to use an electromagnetic wave having a frequency of 1 GHz or higher.

The electromagnetic wave generator 16 can be a magnetron, a klystron, a travelling wave tube, a gyrotron or the like. Here, a gyrotron is used as the electromagnetic wave generator 16, and an electromagnetic wave generated by the gyrotron has a frequency of 28 GHz. In addition, the electromagnetic wave generated by the gyrotron may have a frequency of 82.9 GHz, 110 GHz, 168 GHz, 874 GHz or the like.

The waveguide 20 is formed by, e.g., a cylindrical or a rectangular waveguide, a corrugated waveguide or the like. The incident antenna unit 18 is provided with a plurality of mirror surface reflection lenses or reflection mirrors (not shown), and is configured to introduce an electromagnetic wave into the processing chamber 4. Provided to the processing chamber 4 is a gas introducing unit 22 for introducing required gas into the processing chamber 4. Specifically, gas inlet ports 24 are respectively provided at an upper sidewall and a lower sidewall of the processing chamber 4 and connected to branched ends of a gas passage 26.

An opening/closing valve 28 and a flow rate controller 30 such as a mass flow controller are provided in the gas passage 26, so that a gas for heat treatment can be supplied at a controlled flow rate. A single type or a plurality of types of gases can be used for the gas for heat treatment. Besides, a nonreactive gas, e.g., $N_2$ gas or a rare gas such as Ar gas, can be introduced as a purge gas. The number of the gas inlet ports 24 is not limited to two. Further, a gas nozzle made of quartz or the like may be used instead of the illustrated gas inlet ports 24.

A gas exhaust unit 32 for exhausting the atmosphere in the processing chamber 4 is provided at the processing chamber 4. Specifically, a gas exhaust port 34 is provided at a vertically central portion of the sidewall of the chamber, which is opposite to the gas inlet ports 24. A gas exhaust passage 36 forming a part of the gas exhaust unit 32 is connected to the gas exhaust port 34. A pressure control valve 38, e.g., a butterfly valve, and a gas exhaust pump 40 are provided on the gas exhaust passage 36 in that order toward the downstream side, so that the atmosphere in the processing chamber 4 can be exhausted. The processing in the processing chamber 4 can be carried out under the vacuum atmosphere or the atmospheric atmosphere (including a pressure close to the atmospheric pressure). When the processing is performed under the vacuum atmosphere, a combination of a turbo molecular pump and a dry pump which ensures a high vacuum level can be used as the gas exhaust pump 40.

In the processing chamber 4, a processing target object holder, i.e., a holding unit 42, for holding a plurality of semiconductor substrates W serving as processing target objects with a predetermined interval therebetween is provided so as to be inserted into and withdrawn from the processing chamber 4. The holding unit 42 is entirely made of a material, e.g., quartz allowing an electromagnetic wave introduced into the processing chamber 4 to transmit therethrough. Specifically, the holding unit 42 includes a top plate 44 and a bottom plate 46 made of quartz, and four quartz supports 48A to 48D for connecting the top plate 44 and the bottom plate 46, as shown in FIGS. 1 and 2. Each of the supports 48A to 48D has engagement grooves 50 formed at a predetermined pitch. By inserting the peripheral portions of the semiconductor substrates W into the engagement grooves 50, the semiconductor substrates W are held by the holding unit 42 at the predetermined pitch.

The four supports 48A to 48D are spaced apart from each other at a predetermined interval on a substantially semicircle region so that a semiconductor substrate W is allowed to be loaded and unloaded in a horizontal direction with respect to the holding unit 42 by a transfer arm (not shown). Here, the semiconductor substrate W has a thin circular plate shape having a diameter of, e.g., about 300 mm. Further, about ten to one hundred fifty semiconductor substrates W can be held by the holding unit 42 at a predetermined pitch. Moreover, the diameter of the semiconductor substrate W is not limited to 300 mm, and may be another size, e.g., 200 mm or 450 mm.

A lid 52, i.e., a closing body, made of metal same as that forming the processing chamber 4 is detachably attached to the loading/unloading opening 6 provided at the bottom of the processing chamber 4 via a sealing member 54, e.g., an O-ring or the like. An inner surface of the lid 52 (surface facing the inner space of the processing chamber 4) is mirror-finished in order to reflect the electromagnetic wave introduced into the processing chamber 4.

A rotation shaft 58 airtightly passes through the central portion of the lid 52 via a magnetic fluid seal 56. A mounting table 60 is provided at the upper portion of the rotation shaft 58, and the holding unit 42 is mounted and held on the top surface of the mounting table 60. A loading/unloading unit 62 for loading and unloading the holding unit 42 into and from the processing chamber 4 is provided below the processing chamber 4.

Here, an elevator 64 provided with a ball screw 64A serves as the loading/unloading unit 62. A lower end portion of the rotation shaft 58 is rotatably supported at a leading end of an elevation arm 64C provided at an elevation nut 64B of the ball screw 64A, and a rotation motor 66 is attached to the leading end of the elevation arm 64C. The rotation motor 66 rotates the rotation shaft 58 during the processing, so that the holding unit 42 held on the mounting table 60 can be rotated at a predetermined speed. Therefore, when the elevation arm 64C is vertically moved by driving the elevator 64, the lid 52 and the holding unit 42 are vertically moved as one unit, thereby loading and unloading the semiconductor substrates W into and from the processing chamber 4. Moreover, the semiconductor substrates W may be processed without rotating the holding unit 42. In that case, it is unnecessary to provide the rotation motor 66 and the magnetic fluid seal 56.

The bottom side (the loading/unloading opening 6) of the processing chamber 4, is connected to a loader chamber 68 for temporarily accommodating the semiconductor substrates W to be loaded into and unloaded from the processing chamber 4. The loader chamber 68 is formed in a box shape by a loader chamber defining wall 70 made of, e.g., stainless steel, aluminum, or aluminum alloy. The aforementioned elevator 64 is installed in the loader chamber 68. The entire processing chamber 4 is supported by a ceiling plate 70A for defining the loader chamber 68. The upper end and the lower end of a screw shaft of the ball screw 64A are respectively supported at the ceiling plate 70A and a bottom plate 70B for defining the loader chamber 68.

A transport opening 72 having a length substantially identical to that of the holding unit 42 is formed at a side plate 70C defining the loader chamber 68. An openable and closable door 74 for airtightly blocking the transport opening 72 is provided at the transport opening 72 via a sealing member 76 such as an O-ring or the like. Further, in a state where the door 74 is opened, the semiconductor substrates W can be transferred to and from the holding unit 42 by a transfer arm (not shown) provided at the outside of the loader chamber 68.

A gas inlet 78 is provided at the loader chamber defining wall 70. Further, the gas inlet 78 is connected to a gas passage 82 in which an opening/closing valve 80 is provided, so that a nonreactive gas or clean air can be introduced into the loader chamber 68 when necessary. The nonreactive gas can be $N_2$ gas or a rare gas such as Ar.

A gas outlet 84 is provided at the loader chamber defining wall 70, and is connected to a gas exhaust passage 86. An opening/closing valve 88 and a gas exhaust unit 90 are provided in the gas exhaust passage 86 in that order, so that the atmosphere in the loader chamber 68 can be exhausted. When the loader chamber 68 is used only under the atmospheric atmosphere, a gas exhaust fan can be used as the gas exhaust unit 90. Meanwhile, in case where the loader chamber 68 is used as a load-lock chamber in which the atmospheric atmosphere and the vacuum atmosphere is selectively switched, a vacuum pump such as a dry pump or the like is used as the gas exhaust unit 90.

The entire operation of the processing apparatus 2 configured as described above is controlled by an apparatus control unit 92 including, e.g., a computer or the like. A program of the computer for performing a control operation is stored in a storage medium 94 such as a flexible disc, a CD (Compact Disc), a hard disc, a flash memory, a DVD or the like. Specifically, start and stop of gas supply, a gas flow rate, a power of an electromagnetic wave, a process temperature, a pressure or the like are controlled in accordance with an instruction from an apparatus control unit 92.

Hereinafter, an operation of the processing apparatus 2 configured as described above will be described. First, the elevator 64 serving as the loading/unloading unit 62 provided in the loader chamber 68 is driven to move down the elevation arm 64C. Accordingly, the holding unit 42 is unloaded from the processing chamber 4 and is positioned in the loader chamber 68 as indicated by a dashed dotted line in FIG. 1. The inside of the loader chamber 68 is set to the predetermined atmosphere, e.g., the atmospheric atmosphere, by introducing the nonreactive gas, e.g., $N_2$ gas or a rare gas such as Ar gas, or clean air in advance.

As described above, when the holding unit 42 is unloaded, the door 74 that has blocked the transport opening 72 of the loader chamber 68 is opened. Then, the transfer arm (not shown) installed at the outside of the transport opening 72 is extended and contracted and vertically moved to transfer unprocessed semiconductor substrates W to be held by the engagement grooves 50 of the supports 48A to 48D of the unloaded holding unit 42 (see FIG. 2). Thus, a predetermined number of semiconductor substrates W are held by the holding unit 42. Each semiconductor substrate W can be, e.g., a circular plate-shaped silicon substrate. Upon completion of the transport of the semiconductor substrates W, the loader chamber 68 is sealed by closing the door 74.

Next, the elevation arm 64C is slowly raised by driving the elevator 64, and the semiconductor substrates W are loaded into the processing chamber 4 by loading the holding unit 42 through the loading/unloading opening 6 into the processing chamber 4. When the holding unit 42 is completely loaded into the processing chamber 4, the loading/unloading opening 6 disposed at the bottom of the processing chamber 4 is airtightly closed by the lid 52.

Upon completion of the loading of the semiconductor substrates W into the processing chamber 4, the semiconductor substrates W are subjected to a predetermined process. Here, the case where an annealing process is performed as a predetermined process under the vacuum atmosphere will be described as an example. First, the inside of the processing chamber 4 is vacuum-exhausted to the depressurized atmosphere by the gas exhaust unit 32 in the processing chamber 4 and, at the same time, a nonreactive gas, e.g., $N_2$ gas or a rare gas such as Ar gas is introduced from the gas introducing unit 22 into the processing chamber 4 at a controlled flow rate. Further, a pressure in the processing chamber 4 is maintained at a predetermined process pressure by the pressure control valve 38. Then, the holding unit 42 holding the semiconductor substrates W is rotated. The process may be performed while fixing the holding unit 42 without rotating the holding unit 42.

By operating the electromagnetic wave supply unit 14 while maintaining the pressure in the processing chamber 4 at a predetermined level of the vacuum atmosphere, an electromagnetic wave having a frequency of, e.g., 28 GHz, is generated by the electromagnetic wave generator 16. The generated electromagnetic wave is guided along the waveguide 20 to the incident antenna unit 18 provided at the upper portion of the processing chamber 4. Thereafter, the electromagnetic wave radiated through the incident antenna unit 18 passes through the transmission plate 12 made of quartz and then is introduced into the processing chamber 4 through a ceiling portion thereof. The electromagnetic wave is reflected multiple times between the semiconductor substrates W held by the holding unit 42 at multiple stages, and some of the electromagnetic wave is absorbed by the semiconductor substrates W. Accordingly, the temperatures of the surfaces of the semiconductor substrates W are rapidly increased by the electromagnetic wave heating.

Further, since the inner surface of the processing chamber 4 made of metal or the inner surface of the lid 52 is mirror-finished, the introduced electromagnetic wave can be effectively reflected. Therefore, the synergy effect is achieved by effectively reflecting the electromagnetic wave and reflecting the electromagnetic wave multiple times between the semiconductor substrates W as described above, so that the electromagnetic wave can be uniformly propagated over the entire processing chamber 4 despite the fact that the electromagnetic wave is introduced through the ceiling portion of the processing chamber 4. Hence, the temperatures of the surfaces of the semiconductor substrates W are rapidly increased, and the semiconductor substrates can be annealed while ensuring in-plane uniformity and inter-plane uniformity. As a result, the throughput of the processing of the semiconductor substrates W can be improved considerably.

In this case, if twelve semiconductor wafers, each having a diameter of 300 mm and serving as a semiconductor substrate W, are accommodated, the temperature increasing rate of each of the semiconductor substrates W is, e.g., about 100° C./sec. Here, the output power of the electromagnetic wave generator 16 is, e.g., about 100 kW. However, the output power thereof is not particularly limited thereto. Further, the semiconductor substrates W accommodated in the processing chamber 4 lead to an increase in the load absorption capacity in the processing chamber 4. Therefore, generation of an excessive amount of reflected waves of the electromagnetic wave can be suppressed. As a result, the electromagnetic wave supply unit 14 does not require an interlock function for an excessive amount of reflected waves, and this leads to a reduction in the apparatus cost.

Since the electromagnetic wave is reflected by the inner surface of the processing chamber 4 as described above, the temperature of the processing chamber 4 is hardly increased. Thus, the energy of the electromagnetic wave is only applied to the semiconductor substrates W, and this leads to an increase of the energy efficiency. Besides, the holding unit 42 for holding the semiconductor substrates W is made of a material, e.g., quartz, allowing the electromagnetic wave to transmit therethrough, so that the energy absorption does not occur at the holding unit 42. As a consequence, the energy efficiency is further increased.

After the annealing process of a predetermined period of time is completed, the generation of the electromagnetic wave is interrupted by stopping the operation of the electromagnetic wave supply unit 14, and the interior atmosphere of the processing chamber 4 is returned to the atmospheric pressure by introducing a nonreactive gas into the processing chamber 4. When the pressure in the processing chamber 4 is returned to the atmospheric pressure, the elevation arm 64C of the elevator 64 is moved downward by driving the loading/unloading unit 62 in the loader chamber 68. Accordingly, the holding unit 42 is lowered from the processing chamber 4, and the processed semiconductor substrates W are unloaded toward the loader chamber 68 maintained under the atmospheric atmosphere. Upon completion of the unloading of the semiconductor substrates W, the door 74 is opened, and the processed semiconductor substrates W are unloaded from the holding unit 42 and transferred by using a transfer arm (not shown). Next, a plurality of unprocessed semiconductor substrates W is transferred to the empty holding unit 42, and the aforementioned series of operations are performed again.

As described above, in accordance with the present embodiment, it is possible to process a plurality of processing target objects, i.e., semiconductor substrates W, at a time. Hence, a throughput can be improved, and a load adsorption capacity in the processing chamber 4 can be increased. As a consequence, the generation of an excessive amount of reflected waves can be suppressed, and the need for the interlock function against generation of an excessive amount of reflected waves can be eliminated.

When the annealing process is performed under the vacuum atmosphere as described above, a load-lock function for switching the atmosphere in the loader chamber 68 between the vacuum atmosphere and the atmospheric atmosphere may be provided. In that case, a gate valve may be provided at an opening formed at the bottom of the processing chamber 4 so that the opening can be airtightly closed and opened. Further, the lid 52 may be airtightly coupled to and separated from the bottom side of the gate valve in an open state.

In such case, while the inside of the loader chamber 68 is set to the atmospheric pressure in order to transfer the semiconductor substrates W from the holding unit 42 by opening the door 74 in the loader chamber 68, the processing chamber 4 is maintained under the vacuum atmosphere by closing the gate valve. In order to load the semiconductor substrates W into the processing chamber 4, the atmosphere in the loader chamber 68 is exhausted to the vacuum atmosphere before opening the gate valve. Thereafter, the gate valve is opened, and the holding unit 42 on which the semiconductor substrates W are mounted is raised and loaded into the processing chamber 4. Next, the loading/unloading opening 6 formed at the bottom of the processing chamber 4 is airtightly closed by the lid 52. The annealing process is carried out in a state where the gate valve is opened.

Then, in order to unload the processed semiconductor substrates W, the inside of the loader chamber 68 is set to the vacuum atmosphere in advance. In that state, the holding unit 42 on which the semiconductor substrates W are mounted is lowered and unloaded from the processing chamber 4. When the unloading operation is completed, the gate valve is closed, and the processing chamber 4 is maintained in the vacuum state. Next, the inside of the loader chamber 68 is returned to the atmospheric pressure and, then, the door 74 is opened to transfer the semiconductor substrates W from the holding unit 42 as described above. In that case, as described above, a vacuum pump is used as the gas exhaust unit 90 for exhausting the atmosphere in the loader chamber 68.

In the above embodiment, the annealing process is performed under the vacuum atmosphere. However, it is not limited thereto, and the annealing process may be performed under the atmospheric atmosphere (including the atmosphere close to the atmospheric pressure). In this case, the inside of the loader chamber 68 is maintained only under the atmospheric atmosphere, and a gas exhaust fan is used as the gas exhaust unit 90.

<Frequency Characteristics of Absorption Energy Density Index (Index of Absorption Energy) Obtained in the Case of Heating by Using Electromagnetic Wave>

Figure 3:
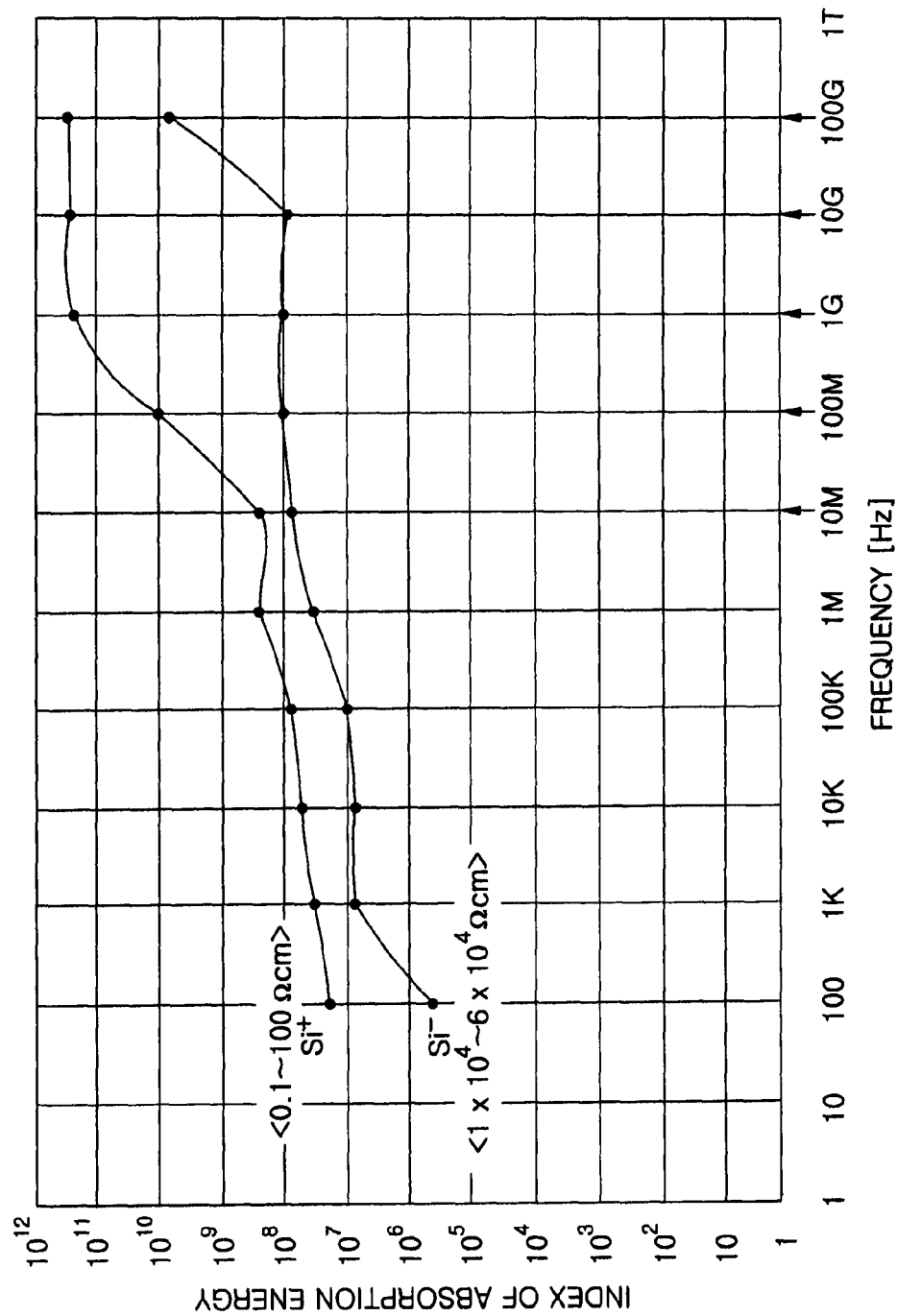
FIG. 3 is a graph showing high frequency characteristics of an absorption energy density index (index of absorption energy) obtained in the case of heating by using an electromagnetic wave.

Hereinafter, a test result of examining the frequency of the electromagnetic wave which is suitable for a semiconductor substrate will be described. FIG. 3 is a graph showing frequency characteristics of the absorption energy density index obtained in the case of heating by using an electromagnetic wave, wherein a frequency is indicated in a horizontal axis, and an absorption energy density index (f.∈.tan δ) is indicted in a vertical axis. Here, ⌈f⌋ represents a frequency of an electromagnetic wave; ⌈∈⌋ represents a relative dielectric constant of a semiconductor substrate; and ⌈tan δ⌋ represents a dissipation factor of a semiconductor substrate. In the test, a silicon substrate was used as a semiconductor substrate, and silicon substrates having two different resistivities were examined while varying a doping amount of impurities. A notation ⌈Si+⌋ on the graph denotes a resistivity ranging from 0.1 to 100 Ωcm, and a notation ⌈Si−⌋ denotes a resistivity ranging from $1 \times 10^4$ to $6 \times 10^4$ Ωcm.

Referring to FIG. 3, in case of Si+, the absorption energy density index starts to be increased sharply when the frequency exceeds about 10 MHz and is substantially saturated when the frequency is about 1 GHz. Therefore, in case of Si+, it is preferable to set the frequency of the electromagnetic wave to 10 MHz or higher, preferably 100 MHz or higher, and more preferably 1 GHz or higher at which the absorption energy density index is saturated. In that case, a maximum frequency is about 10 THz, and preferably about 100 GHz. When the frequency of the electromagnetic wave exceeds 10 THz, the penetration depth of the electromagnetic wave is significantly reduced with respect to the thickness of the substrate, and the electromagnetic wave starts to be reflected on the surface of the substrate. Accordingly, the heating efficiency is decreased, which is not desirable.

In case of Si−, the absorption energy density index is not sharply changed compared to that in case of Si+. However, when the frequency is about 10 MHz, the absorption energy density index is increased to a certain level (about 100 M) and becomes substantially saturated temporarily. When the frequency exceeds 10 GHz, the absorption energy density index starts to be increased sharply. Therefore, in case of Si−, it is preferable to set the frequency of the electromagnetic wave to 10 MHz or higher, and preferably 10 GHz or higher. In case of Si−, a maximum frequency is about 10 THz as in the case of Si+, and preferably about 100 GHz. In case of Si− as well, when the frequency of the electromagnetic wave exceeds 10 THz, the penetration depth of the electromagnetic wave is significantly reduced with respect to the thickness of the substrate, and the electromagnetic wave starts to be reflected on the surface of the substrate. Hence, the heating efficiency is decreased, which is not preferable.

<Second Embodiment>

Figure 4:
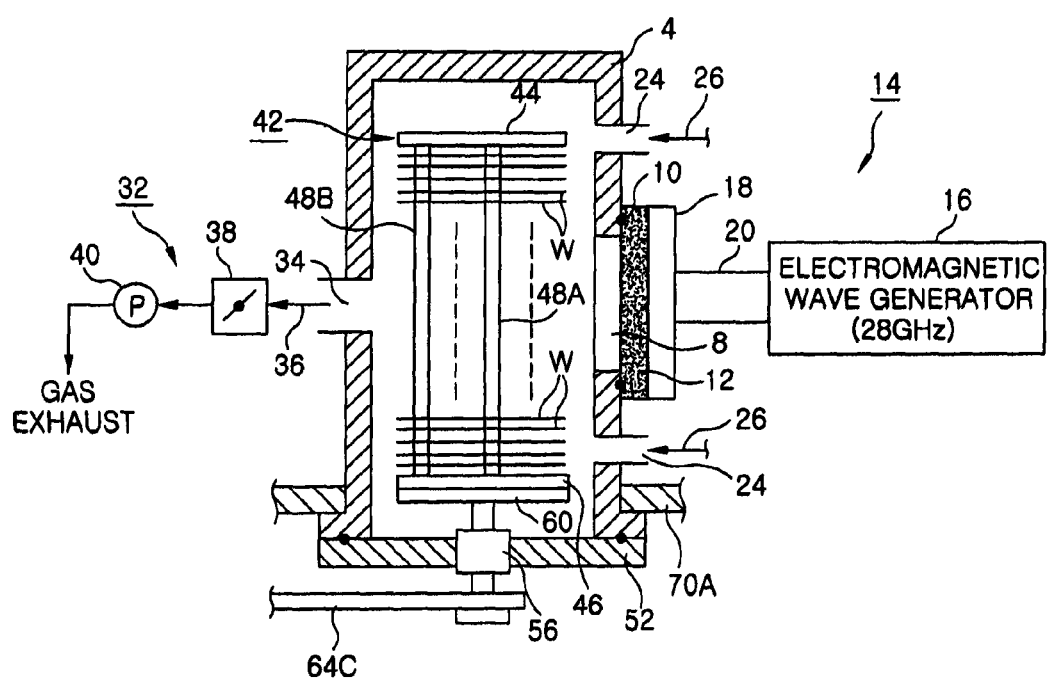
FIG. 4 is a cross sectional configuration view showing a part of a processing apparatus in accordance with a second embodiment of the present invention.

In the first embodiment shown in FIG. 1, the electromagnetic wave introduction opening 8 and the transmission plate 12 are provided at the upper portion (ceiling portion) of the vertical processing chamber 4. However, it is not limited thereto, and the configuration shown in FIG. 4 may be employed. FIG. 4 is a cross sectional configuration view showing a part of a processing apparatus in accordance with a second embodiment of the present invention. Like reference numerals will be given to like parts shown in FIGS. 1 and 2, and redundant description thereof will be omitted.

Here, the electromagnetic wave introduction opening 8 and the transmission plate 12 are provided at a substantially vertically central portion of the sidewall of the processing chamber 4, as can be seen from FIG. 4. Moreover, the electromagnetic wave supply unit 14 including the incident antenna unit 18 and the like is provided at a position outside the transmission plate 12. The second embodiment can provide the same operational effects as those of the first embodiment.

<Examination on In-Plane Temperature Uniformity and Inter-Plane Temperature Uniformity>

Figure 5:
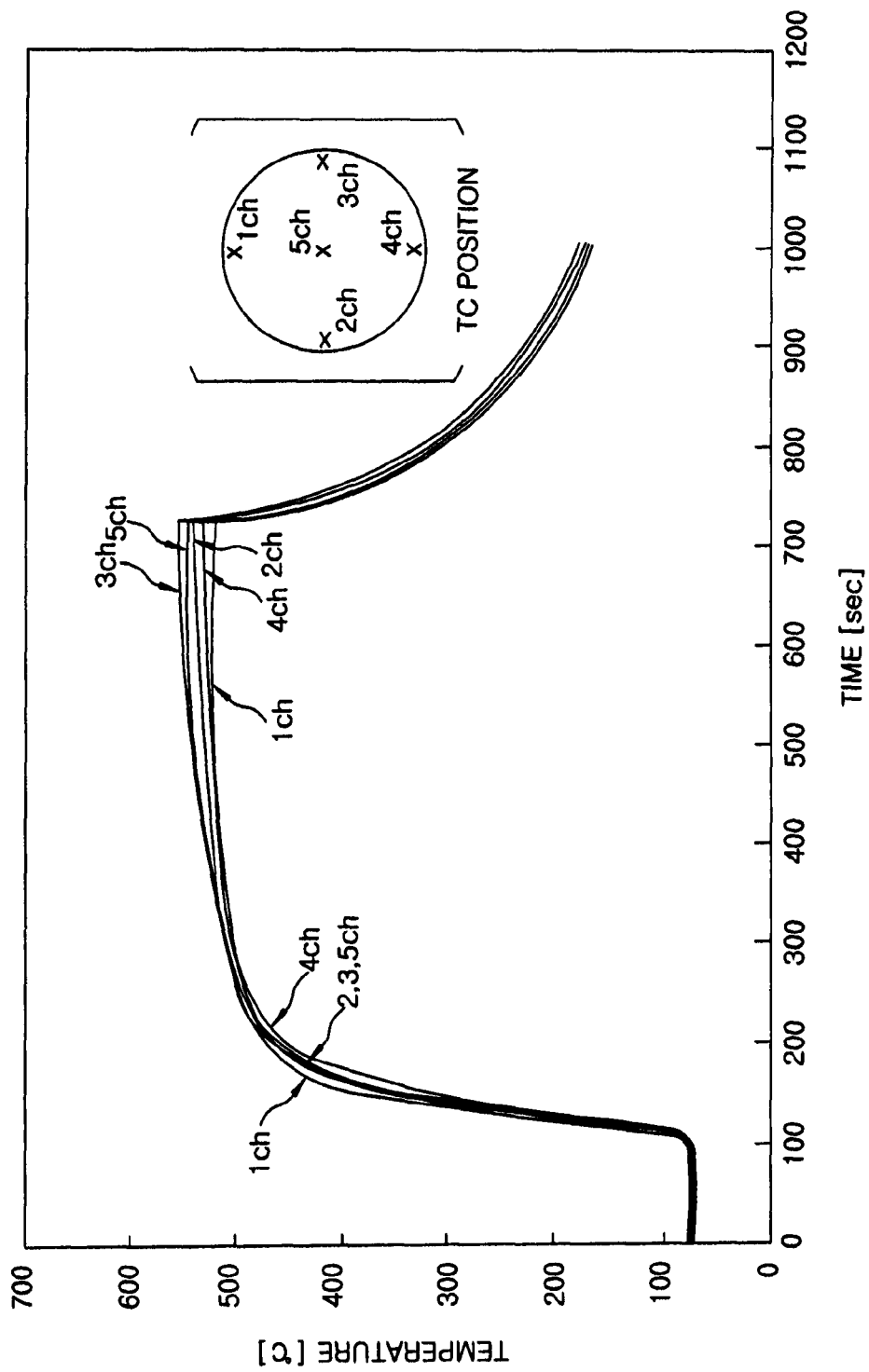
FIG. 5 is a graph showing in-plane uniformity of a temperature in a semiconductor substrate.
Figure 6:
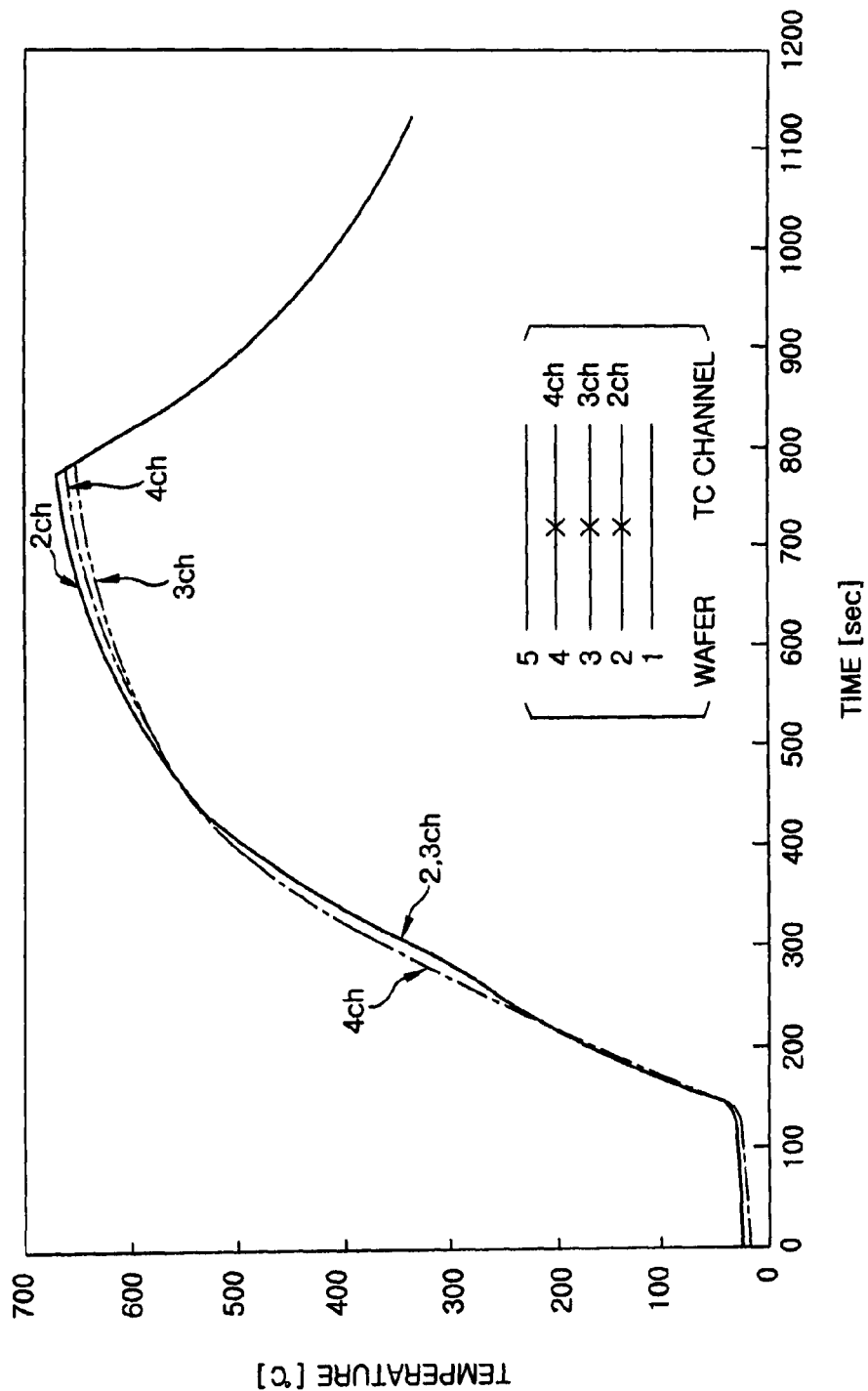
FIG. 6 is a graph showing inter-plane uniformity of temperatures in semiconductor substrates.

Here, test results of examining in-plane temperature uniformity and inter-plane temperature uniformity of semiconductor substrates in the first and the second embodiment will be described. FIG. 5 illustrates a graph showing in-plane uniformity of a temperature of a semiconductor substrate, and FIG. 6 illustrates a graph showing inter-plane uniformity of temperatures of semiconductor substrates. A thermocouple TC is used to measure the temperature of the semiconductor substrate, and measurement portions are schematically illustrated in the drawings. In the case of FIG. 5, thermocouples TC are respectively provided at four points in the peripheral portion and at one point in the central portion of the semiconductor substrate. In the case of FIG. 6, five semiconductor substrates (wafers) are spaced apart from each other in a vertical direction at a certain interval, and thermocouples TC are respectively provided at central portions of three intermediate wafers. The temperatures measured by the thermocouples TC are indicated as TC channels (ch).

Here, a silicon substrate having a diameter of 200 mm was used as a semiconductor substrate W, and an electromagnetic wave of 28 GHz was applied. The input power of the electromagnetic wave was 2 kW in each of FIGS. 5 and 6. In the case of FIG. 5, two of the total semiconductor substrates were heated. In the case of FIG. 6, five of the total semiconductor substrates were heated. In the case of FIG. 5, the processing pressure in the processing chamber 4 was set to the atmospheric pressure. In the case of FIG. 6, the processing pressure in the processing chamber 4 was also set to the atmospheric pressure.

First, in order to examine the in-plane temperature uniformity, temperatures of respective parts of the semiconductor substrate as shown in FIG. 5 were measured at the time when the electromagnetic wave was applied to them for about 700 seconds. As a result, it was shown that the temperatures of the respective parts reached about 500° C. when about 200 seconds elapsed from the start of the application of the electromagnetic wave. The temperatures were in the range of about 525° C. to 550° C. when about 400 seconds elapsed from about 200 seconds even though the electromagnetic wave was constantly applied. In other words, since the in-plane temperature of the semiconductor substrate is maintained in such small range of about 525° C. to 550° C., the in-plane temperature uniformity can be maintained at a comparatively high level.

Next, in order to examine the inter-plane temperature uniformity, the temperatures of the central portions of three semiconductor substrates were measured as shown in FIG. 6 at the time when the electromagnetic wave was applied to them for about 600 seconds. As a result, it was shown that the temperatures of the three semiconductor substrates were increased to about 650° C. without a large difference therebetween, and also shown that the temperature difference between the three semiconductor substrates was about 20° C. at the maximum even at the temperature of 600° C. or higher. Accordingly, the inter-plane temperature uniformity of the semiconductor substrates can be maintained at a comparatively high level.

<Third Embodiment>

Figure 7:
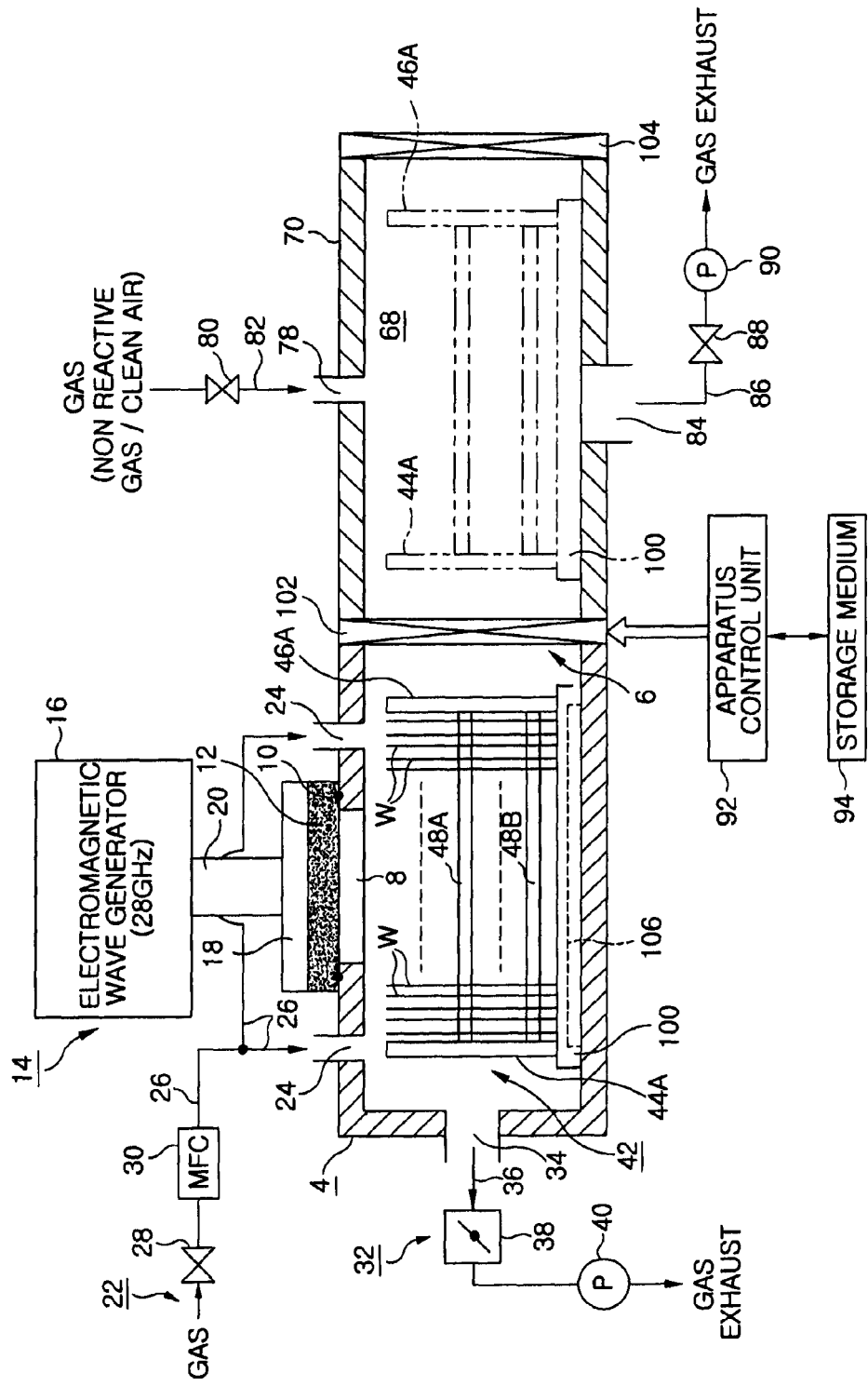
FIG. 7 is a configuration view showing a processing apparatus in accordance with a third embodiment of the present invention.
Figure 8:
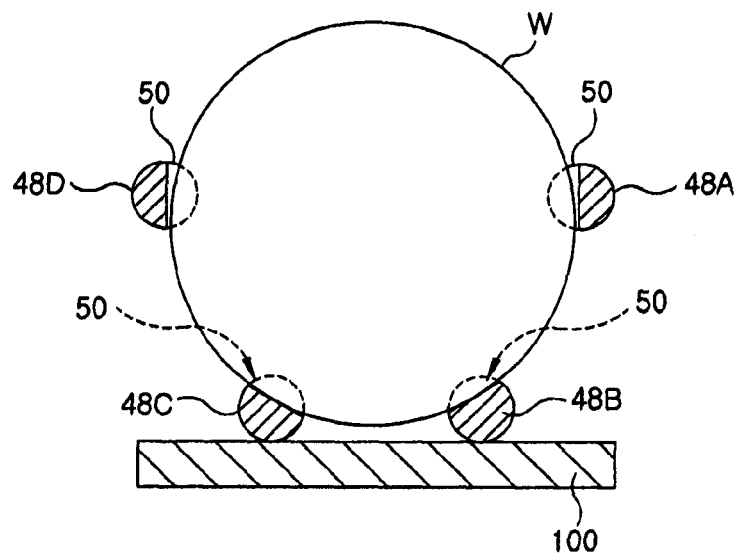
FIG. 8 is a cross sectional view of a holding unit.

Hereinafter, a processing apparatus in accordance with a third embodiment of the present invention will be described. In the first and the second embodiment, the processing chamber 4 is installed with a longitudinal direction thereof extending in a gravitational direction. However, it is not limited thereto, and the processing chamber 4 may be configured as a processing apparatus installed with a longitudinal direction thereof extending in a horizontal direction. FIG. 7 is a configuration view showing a processing apparatus in accordance with a third embodiment of the present invention, and FIG. 8 is a cross sectional view of a holding unit. Moreover, like reference numerals will be given to like parts in FIGS. 1 to 4, and redundant description thereof will be omitted.

As shown in FIG. 7, the metallic processing chamber 4 is horizontally arranged with a longitudinal direction thereof extending along a horizontal direction. The electromagnetic wave introduction opening 8 is provided at a substantially longitudinally central portion of an upper portion of the wall (the circumferential wall) surrounding the processing chamber 4, and is airtightly sealed by the transmission plate 12. Further, the electromagnetic wave supply unit 14 including the incident antenna unit 18 and the like is provided at a position outside of on the transmission plate 12.

The gas inlet ports 24 are provided near both longitudinal ends of the upper portion of the wall of the processing chamber 4. The gas passage 26 of the gas introducing unit 22 is branched to connect with each of the gas inlet ports 24, so that a required gas can be supplied into the processing chamber 4. Besides, the gas exhaust port 34 is provided at one side of the processing chamber 4 in the longitudinal direction thereof, and is connected to the gas exhaust passage 36 of the gas exhaust unit 32. In the present embodiment as well, the inside of the processing chamber 4 can be set to the vacuum atmosphere or the atmospheric atmosphere depending on a processing pressure during the processing.

Further, the holding unit 42 which is made of quartz and holds the semiconductor substrates W as processing target objects is accommodated in the processing chamber 4 with the longitudinal direction thereof extending along a horizontal direction. The top plate 44 and the bottom plate 46 shown in FIG. 1 serve as end plates 44A and 46A, respectively, and the four supports 48A to 48D extend between the end plates 44A and 46A, as can be seen from FIG. 8. Moreover, the holding unit 42 holds the peripheral portions of the semiconductor substrates W in an upright position by using the engagement grooves 50 formed at a predetermined pitch in each of the supports 48A to 48D. This structure of the holding unit 42 is only an example, and the structure of the holding unit 42 is not limited thereto.

In the present embodiment, the entire holding unit 42 is installed on the base 100. A slider 106 serving as the loading/unloading unit 62 is provided at the base 100, so that the base 100 can be moved along the bottom of the processing chamber 4, e.g., in a sliding manner as will be described later. Further, the loading/unloading opening 6 is provided at the other side of the processing chamber 4 in the longitudinal direction thereof. A gate valve 102 serving as a closing body having a function same as that of the lid 52 of the first embodiment is detachably attached to the loading/unloading opening 6, so that the loading/unloading opening 6 can be airtightly closed and opened.

The gate valve 102 is connected to a cylindrical loader chamber defining wall 70 for defining the loader chamber 68.

An outer gate valve 104 serving as a door is provided at the end portion of the loader chamber 68 which is opposite to the end portion where the gate valve 102 is installed. When the gate valve 104 is opened, the loader chamber 68 can be opened to the atmosphere. The base 100 having the slider 106 can move reciprocally between the processing chamber 4 and the loader chamber 68 by a driving mechanism (not shown). Further, when the outer gate valve 104 is opened, the base 100 can be moved to the outside of the loader chamber 68 in a sliding manner.

A gas inlet 78 is provided at an upper portion (ceiling portion) of the loader chamber defining wall 70. Moreover, a gas passage 82 in which an opening/closing valve 80 is provided is connected to the gas inlet 78, so that a nonreactive gas or the like can be supplied into the loader chamber 68. A gas outlet 84 is provided at a bottom portion of the loader chamber defining wall 70. A gas exhaust passage 86 in which an opening/closing valve 88 and a gas exhaust unit 90 are provided is connected to the gas outlet 84, so that the atmosphere in the loader chamber 68 can be exhausted. In the present embodiment as well, a fan can be used as the gas exhaust unit 90 when the inside of the loader chamber 68 is substantially maintained only under the atmospheric pressure. Further, when the loader chamber 68 has a load-lock function for selectively setting the inside of the loader chamber 68 between the vacuum atmosphere and the atmospheric atmosphere, a vacuum pump can be used as the gas exhaust unit 90.

The operation of the third embodiment configured as described above is basically the same as that of the first and the second embodiment, so that the third embodiment can provide the same operational effects as the first and the second embodiment. Specifically, in order to transfer unprocessed semiconductor substrates W to the holding unit 42 and transfer processed semiconductor substrates W from the holding unit 42, the outer gate valve 104 for sealing the loader chamber 68 is opened, and the base 100 on which the holding unit 42 is mounted is moved to the outside (right direction in FIG. 7) of the loader chamber 68 in a sliding manner through the opened gate valve 104. In that state, the transfer operation with respect to the holding unit 42 is carried out by using a transfer arm (not shown).

In order to process unprocessed semiconductor substrates W, the base 100 on which the holding unit 42 holding the unprocessed semiconductor substrates W are mounted is moved into the loader chamber 68 from the outside in a sliding manner and, then, the loader chamber 68 is sealed by closing the outer gate valve 104. Here, in case where the processing pressure in the processing chamber 4 is substantially maintained under the atmospheric atmosphere during the process, the base 100 is moved into the processing chamber 4 by opening the gate valve 102 for blocking the loader chamber 68 and the processing chamber 4 without controlling the pressure in the loader chamber 68. Next, the processing chamber 4 is sealed by closing the gate valve 102 and, then, the annealing process using an electromagnetic wave or the like is performed under the atmospheric atmosphere as described above.

On the other hand, in case where the processing pressure in the processing chamber 4 is maintained under a vacuum atmosphere during the processing, the pressure in the loader chamber 68 is reduced from the atmospheric atmosphere to the vacuum atmosphere so as to be substantially the same as the pressure in the processing chamber 4 preset to the vacuum atmosphere. When the pressure in the loader chamber 68 becomes substantially the same as that in the processing chamber 4, the gate valve 102 for blocking the loader chamber 68 and the processing chamber 4 is opened, and the base 100 is moved into the processing chamber 4 in a sliding manner. Next, the processing chamber 4 is sealed by closing the gate valve 102 and, then, the annealing process using an electromagnetic wave or the like is performed under the vacuum atmosphere as described above.

When the processing is completed, the operation is carried out in the reverse sequence as described above. Specifically, the gate valve 102 is opened, and the base 100 holding the processed semiconductor substrates W is moved in a sliding manner toward the loader chamber 68 maintained in a vacuum state. Thereafter, the gate valve 102 is closed, and the pressure inside of the loader chamber 68 is switched to the atmospheric pressure. Next, the outer gate valve 104 is opened, and the base 100 is moved in a slinging manner to the outside of the loader chamber 68 so that the transfer operation can be carried out.

As described above, the third embodiment can provide the operational effects same as those in the first and the second embodiment. Further, in the third embodiment, in case where the processing pressure is maintained under the vacuum atmosphere, the pressure in the processing chamber 4 is constantly maintained under the vacuum atmosphere during the processing while the loader chamber 68 has a load-lock function. However, it is not limited thereto. The inside of the loader chamber 68 may be constantly maintained at the atmospheric pressure while the inside of the processing chamber 4 may be switched between the atmospheric atmosphere and the vacuum atmosphere such that the inside of the processing chamber 4 is set to the atmospheric atmosphere when the semiconductor substrates W are loaded into and unloaded from the processing chamber 4 and is vacuum-exhausted to the vacuum to perform the processing under the vacuum atmosphere.

<Fourth Embodiment>

Hereinafter, a fourth embodiment of the present invention will be described. In the first to third embodiments, the semiconductor substrates are accommodated in an exposed state in the processing chamber 4. However, it is not limited thereto, and an inner processing chamber for surrounding the semiconductor substrates may be provided in the processing chamber 4 in order to prevent metal contamination from the processing chamber 4 (double tube structure).

Figure 9:
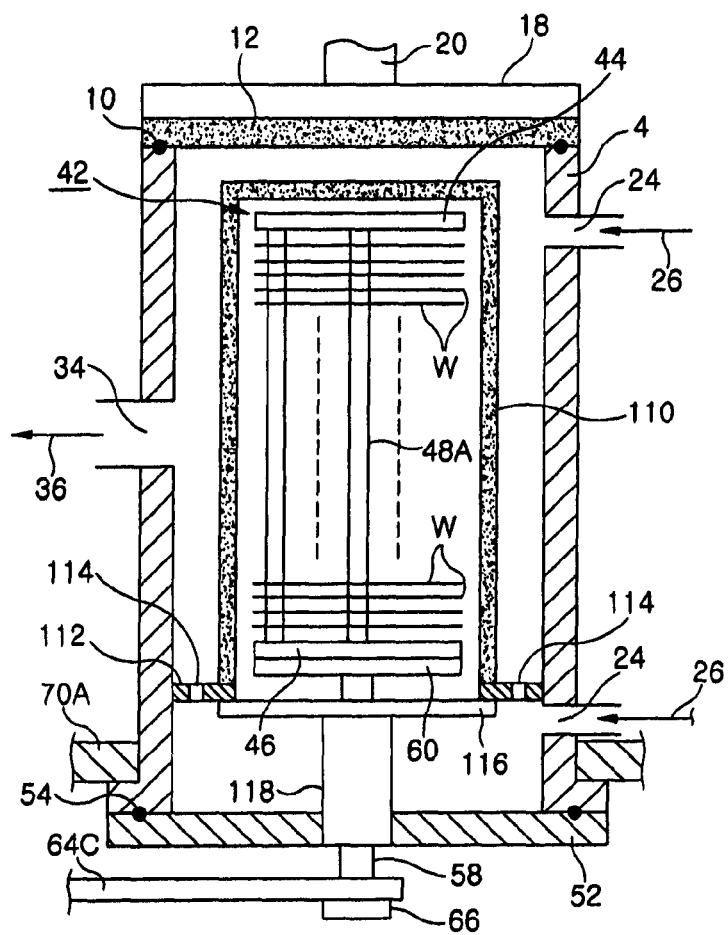
FIG. 9 is a configuration view showing a part of a processing apparatus in accordance with a fourth embodiment of the present invention.
Figure 10:
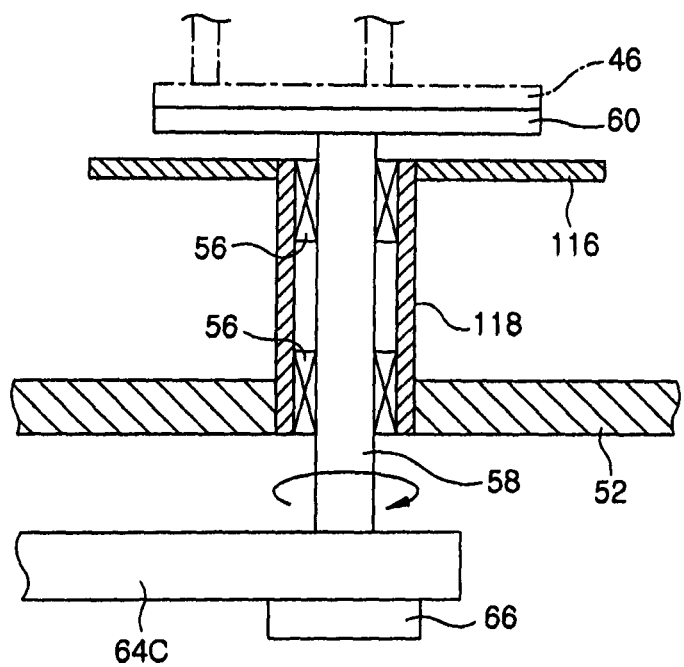
FIG. 10 is an enlarged fragmentary cross sectional view showing an inner opening/closing lid of the fourth embodiment.

FIG. 9 is a configuration view showing a part of a processing apparatus in accordance with the fourth embodiment of the present invention, and FIG. 10 is an enlarged fragmentary cross sectional view showing an inner opening/closing lid of the fourth embodiment. In FIG. 9, like reference numerals will be given to like parts in FIGS. 1, 4 and 7, and redundant description thereof will be omitted. In the fourth embodiment, the inner processing chamber 110 is provided in the processing chamber 4 as described above. The side circumferential wall of the processing chamber 4 and that of the inner processing chamber 110 are concentrically arranged when viewed from a horizontal cross section.

Specifically, the inner processing chamber 110 is formed in a cylindrical shape having a ceiling, and one end thereof (bottom in the illustrated example) is opened. The entire inner processing chamber 110 is made of a material, e.g., quartz allowing an electromagnetic wave to transmit therethrough, which is the same material that forms the transmission plate 12. A supporting table 112 formed in, e.g., a circular ring shape, is fixed to the lower sidewall of the processing chamber 4. The entire inner processing chamber 110 is supported at its bottom on the supporting table 112. The supporting table 112 is made of metal same as that forming the processing chamber 4, and is fixed to the inner wall of the processing chamber 4 by welding or the like.

A circular ring-shaped supporting table 112 is provided with a plurality of ventholes 114 formed therethrough in a vertical direction. Thus, the space below the supporting table 112 communicates with the space between the processing chamber 4 and the inner processing chamber 110. When the holding unit 42 is raised, the holding unit 42 is accommodated in and surrounded by the inner processing chamber 110.

In the present embodiment as well as other embodiments, the gas inlet ports 24 are provided at both ends of the processing chamber 4 in the longitudinal direction thereof, and the gas passage 26 is branched to connect with the gas inlet ports 24. Hence, a required gas can be supplied into the processing chamber 4. In that case, in order to rapidly supply the gas into the inner processing chamber 110, it is preferable to attach the lower gas inlet port 24 of the two gas inlet ports 24 to the position below the supporting table 112.

In the present embodiment, an inner lid 116 as a closing body for closing the opening formed at the bottom of the inner processing chamber 110 is provided as one unit with the lid 52. Specifically, a cylindrical hollow coupling shaft 118 is fixed to the upper central portion of the lid 52, and the circular plate-shaped inner lid 116 is fixed to the upper portion of the coupling shaft 118.

When the holding unit 42 is raised, the top surface of the peripheral portion of the circular plate-shaped inner lid 116 comes into contact with the inner bottom surface of the ring-shaped supporting table 112, thereby sealing the inner processing chamber 110.

Further, the rotation shaft 58 inserted through the cylindrical hollow coupling shaft 118, and is rotatably supported in the coupling shaft 118 by the magnetic fluid seal 56. Accordingly, the rotation shaft 58 can be rotated while ensuring the airtightness in the processing chamber 4.

In the fourth embodiment configured as described above, when semiconductor substrates W each of which is formed of a silicon substrate are loaded into the inner processing chamber 110 by raising the holding unit 42, the opening formed at the bottom of the inner processing chamber 110 is closed by the inner lid 116. In other words, all the semiconductor substrates W are airtightly covered by the inner processing chamber 110. If an electromagnetic wave is applied in that state, the electromagnetic wave passes through the transmission plate 12 and the inner processing chamber 110 and reaches the semiconductor substrates W, thereby heating the semiconductor substrates W. Since the semiconductor substrates W are subjected to heat treatment as described above, the operational effects same as those of the first to third embodiments are achieved.

In the fourth embodiment, the semiconductor substrates W are covered by the inner processing chamber 110 made of quartz or the like. Thus, the semiconductor substrates W can be protected from metal contamination that otherwise may be caused from the metallic processing chamber 4 provided at the outside of the inner processing chamber 110.

Due to the presence of the inner processing chamber 110, convection of a gas between the inside and the outside of the inner processing chamber 110 is disturbed, and the heat transfer by the convection can be suppressed. Therefore, the heating efficiency can be remarkably improved. Especially when the heat treatment is performed under the atmospheric pressure or the pressure close thereto, the effect of suppressing the heat transfer by the convection can be increased considerably. Here, the case in which the inner processing chamber 110 of the fourth embodiment is applied to the first embodiment has been described as an example. However, the inner processing chamber 110 of the fourth embodiment can be applied to the second and the third embodiment.

Although the semiconductor substrate is a silicon substrate in the above-described embodiments, a compound semiconductor substrate can also be used without being limited thereto. The compound semiconductor substrate can be a substrate made of a material selected from the group consisting of GaAs, InGaAs, $Al_2O_3$, SiC, GaN, AlN and ZnO. Further, although the annealing process is performed on the semiconductor substrate in the above-described embodiments, it is also possible to perform various heat processes such as a film forming process, an oxidation/diffusion process, a quality modification process and the like without being limited thereto.

What is claimed is:

1. A processing apparatus for performing a heat treatment on a plurality of processing target objects by using an electromagnetic wave, the processing apparatus comprising:
   a metallic outer processing chamber;
   a loading/unloading opening provided in one end of the outer processing chamber;
   an outer closing body for closing and opening the loading/unloading opening;
   a holding unit, loaded and unloaded into and from the outer processing chamber through the loading/unloading opening, for holding the processing target objects at a predetermined interval, the holding unit being made of a material allowing the electromagnetic wave to transmit therethrough;
   an electromagnetic wave supply unit for introducing the electromagnetic wave into the outer processing chamber;
   a gas introducing unit for introducing a gas into the outer processing chamber; and
   a gas exhaust unit for exhausting an atmosphere in the outer processing chamber,
   wherein the processing apparatus further comprises an inner processing chamber, made of a material allowing the electromagnetic wave to transmit therethrough, for accommodating therein the holding unit, and an inner closing body for closing and opening an opening formed at the inner processing chamber to load and unload the holding unit into and from the inner processing chamber,
   wherein the inner processing chamber is disposed inside the outer processing chamber, and
   wherein the gas introducing unit includes one or more gas inlet ports provided at a wall of the outer processing chamber.

2. The processing apparatus of claim 1, wherein an electromagnetic wave introduction opening for introducing the electromagnetic wave into the outer processing chamber is formed at the wall of the outer processing chamber, and a transmission plate made of a material allowing the electromagnetic wave to transmit therethrough is provided at the electromagnetic wave introduction opening.

3. The processing apparatus of claim 2, wherein the electromagnetic wave supply unit includes an electromagnetic wave generator for generating the electromagnetic wave, an incident antenna unit provided on the transmission plate, and a waveguide for connecting the electromagnetic wave generator and the incident antenna unit.

4. The processing apparatus of claim 3, wherein a frequency of the electromagnetic wave generated by the electromagnetic wave generator ranges from 10 MHz to 10 THz.

5. The processing apparatus of claim 1, wherein an inner surface of the outer processing chamber is mirror-finished.

6. The processing apparatus of claim 1, wherein the outer processing chamber is installed with a longitudinal direction thereof extending in a gravitational direction.

7. The processing apparatus of claim 1, wherein the outer processing chamber is installed with a longitudinal direction thereof extending along a horizontal direction.

8. The processing apparatus of claim 1, wherein the loading/unloading opening side of the outer processing chamber is connected to a loader chamber having a loading/unloading unit for loading and unloading the holding unit into and from the outer processing chamber.

9. The processing apparatus of claim 8, wherein the load chamber is set to an atmospheric atmosphere.

10. The processing apparatus of claim 8, wherein the load chamber is configured such that an atmosphere therein is selectively switched between a vacuum atmosphere and an atmospheric atmosphere.

11. The processing apparatus of claim 1, wherein the inner closing body is provided as one unit with the outer closing body for closing and opening the loading/unloading opening of the outer processing chamber.

12. The processing apparatus of claim 1, wherein the processing target objects are semiconductor substrates.

13. The processing apparatus of claim 1, wherein when the inner processing chamber is closed by the inner closing body, communication between the gas inlet ports and an inside of the inner processing chamber is blocked, and when the inner processing chamber is not closed by the inner closing body, the communication is not blocked.

14. The processing apparatus of claim 1, wherein the gas inlet ports have an upper and a lower gas inlet port disposed at an upper and a lower portion of the wall of the outer processing chamber, respectively,
wherein the processing apparatus further comprises a supporting table formed in a circular ring shape and fixed to the lower portion of the wall, the inner processing chamber being supported at its bottom on the supporting table, and
wherein the lower gas inlet port is disposed below the supporting table.

15. The processing apparatus of claim 14, wherein the supporting table is provided with a plurality of ventholes formed therethrough in a vertical direction so that a space below the supporting table communicates with a space between the outer processing chamber and the inner processing chamber.

* * * * *